(12) United States Patent
Nallan et al.

(10) Patent No.: US 6,322,714 B1
(45) Date of Patent: Nov. 27, 2001

(54) PROCESS FOR ETCHING SILICON-CONTAINING MATERIAL ON SUBSTRATES

(75) Inventors: Padmapani Nallan, Sunnyvale; Jeffrey Chinn, Foster City; Stephen Yuen, Santa Clara, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/116,621

(22) Filed: Jul. 16, 1998

Related U.S. Application Data

(63) Continuation-in-part of application No. 08/969,122, filed on Nov. 12, 1997, now Pat. No. 6,136,211.

(51) Int. Cl.$^7$ ............................................. H01L 21/3065
(52) U.S. Cl. ........................... 216/67; 216/79; 252/79.1; 438/714; 438/719; 438/905; 134/1.2; 134/22.1
(58) Field of Search ................................... 216/63, 67, 79; 438/714, 719, 905; 252/79.1, 79.2, 79.3, 79.4; 134/1.1, 1.2, 22.1

(56) References Cited

U.S. PATENT DOCUMENTS

| | | | |
|---|---|---|---|
| 4,282,267 | 8/1981 | Küyel | 427/38 |
| 4,433,228 | 2/1984 | Nishimatsu et al. | 219/10.55 R |
| 4,436,581 | 3/1984 | Okudaira et al. | 156/643 |
| 4,465,532 | 8/1984 | Fukano | 156/643 |
| 4,490,209 | 12/1984 | Hartman | 156/643 |

(List continued on next page.)

FOREIGN PATENT DOCUMENTS

| | | |
|---|---|---|
| 4132559 | 4/1993 | (DE) . |
| 0200951 | 12/1986 | (EP) . |
| 0272143 | 6/1988 | (EP) . |
| 0314990 | 5/1989 | (EP) . |
| 0463373 | 1/1992 | (EP) . |

(List continued on next page.)

OTHER PUBLICATIONS

PCT Search Report dated Oct. 28, 1999.
Aydil, et al., "Multiple Steady States in a Radio Frequency Chlorine Glow Discharge," *J. Appl. Phys.*, Vol. 69, No. 1, Jan. 1, 1991, pp. 109–114.
PCT Search Report dated Nov. 8, 2000.
Applied Materials, Inc., Silicon Etch DPS Centura, (1996).
PCT International Preliminary Examination Report dated Feb. 14, 2000.
Hillenius, S.J., et al., "A Symmetric Submicron CMOS Technology," *IEEE*, pp. 252–255, 1986.
Zaleski, et al., "Tungsten Silicide/Polysilicon Stack Etching using Mixed Flourine–Chlorine Chemistry in a High Density Plasma Chamber", Proceedings of the International Symposium on Plasma Processing, May 3, 1998.
PCT International Search Report dated Jun. 22, 2001, European Patent Office, P.B. 5818 Patentlaan 2, NL–2280 HV Rijswijk.

*Primary Examiner*—Randy Gulakowski
*Assistant Examiner*—Allan Olsen
(74) *Attorney, Agent, or Firm*—Janah and Associates

(57) ABSTRACT

A method of etching a silicon-containing layer 170 on a substrate 45 comprises the steps of placing the substrate 45 on a support 75 in a process chamber 50. The substrate 45 is exposed to an energized process gas comprising a bromine-containing gas, a chlorine-containing gas, an inorganic fluorinated gas, and an oxygen gas. The volumetric flow ratio of the gas constituents is selected so that the energized process gas etches regions 180a,b having different concentrations of dopant in the polysilicon layer 170 at substantially the same etching rate. Optionally, the gas composition is also tailored to simultaneously clean off etch residue from the internal surfaces of a process chamber 50 during etching of the substrate 45.

65 Claims, 5 Drawing Sheets

U.S. PATENT DOCUMENTS

| | | | |
|---|---|---|---|
| 4,502,914 | 3/1985 | Trumpp et al. | 156/643 |
| 4,576,692 | 3/1986 | Fukuta et al. | 204/165 |
| 4,705,595 | 11/1987 | Okudaira et al. | 156/643 |
| 4,738,744 | 4/1988 | Kisa | 156/643 |
| 4,786,352 | 11/1988 | Benzing | 156/345 |
| 4,799,991 * | 1/1989 | Dockrey | 438/719 |
| 4,818,326 | 4/1989 | Liu et al. | 156/345 |
| 4,831,963 | 5/1989 | Saito et al. | 118/723 |
| 4,863,561 | 9/1989 | Freeman et al. | 156/646 |
| 4,867,841 | 9/1989 | Loewenstein et al. | 156/643 |
| 4,876,212 | 10/1989 | Koury | 437/34 |
| 4,975,144 | 12/1990 | Yamazaki et al. | 156/643 |
| 4,992,136 | 2/1991 | Tachi et al. | 156/643 |
| 4,994,410 | 2/1991 | Sun et al. | 437/192 |
| 5,002,632 | 3/1991 | Loewenstein et al. | 156/643 |
| 5,013,398 | 5/1991 | Long et al. | 156/643 |
| 5,035,768 | 7/1991 | Mu et al. | 156/626 |
| 5,084,126 | 1/1992 | McKee | 156/345 |
| 5,094,712 | 3/1992 | Becker et al. | 156/643 |
| 5,110,408 | 5/1992 | Fujii et al. | 156/643 |
| 5,110,411 | 5/1992 | Long | 156/656 |
| 5,118,387 | 6/1992 | Kadomura | 156/657 |
| 5,158,644 | 10/1992 | Cheung et al. | 156/643 |
| 5,160,407 | 11/1992 | Latchford et al. | 156/656 |
| 5,164,330 | 11/1992 | Davis et al. | 437/192 |
| 5,176,792 | 1/1993 | Fullowan et al. | 156/625 |
| 5,188,980 | 2/1993 | Lai | 437/193 |
| 5,192,702 | 3/1993 | Tseng | 437/47 |
| 5,256,245 | 10/1993 | Keller et al. | 156/643 |
| 5,281,302 | 1/1994 | Gabric et al. | 156/643 |
| 5,282,899 | 2/1994 | Balmashonov et al. | 118/723 R |
| 5,312,519 | 5/1994 | Sakai et al. | 134/1 |
| 5,318,668 | 6/1994 | Tamaki et al. | 156/662 |
| 5,338,398 | 8/1994 | Szwejkowski et al. | 156/655 |
| 5,354,417 | 10/1994 | Cheung et al. | 156/643 |
| 5,356,478 | 10/1994 | Chen et al. | 134/1 |
| 5,358,601 | 10/1994 | Cathey | 156/656 |
| 5,378,311 | 1/1995 | Nagayama et al. | 156/643 |
| 5,382,316 | 1/1995 | Hills et al. | 156/643 |
| 5,413,954 | 5/1995 | Aydil et al. | 437/81 |
| 5,431,772 | 7/1995 | Babie et al. | 156/643.1 |
| 5,443,686 | 8/1995 | Jones et al. | 216/37 |
| 5,449,411 | 9/1995 | Fukuda et al. | 118/723 MP |
| 5,514,622 | 5/1996 | Bornstein et al. | 437/189 |
| 5,521,119 | 5/1996 | Chen et al. | 437/187 |
| 5,529,197 | 6/1996 | Grewal | 216/68 |
| 5,620,615 | 4/1997 | Keller | 438/720 |
| 5,626,775 | 5/1997 | Roberts et al. | 216/67 |
| 5,644,153 | 7/1997 | Keller | 257/324 |
| 5,651,856 | 7/1997 | Keller et al. | 156/643.1 |
| 5,677,228 | 10/1997 | Tseng | 437/60 |
| 5,700,741 | 12/1997 | Liao | 438/723 |
| 5,741,396 | 4/1998 | Loewenstein | 156/643.1 |
| 5,753,533 | 5/1998 | Saito | 437/192 |
| 5,756,400 | 5/1998 | Ye at al. | 438/710 |
| 5,767,021 | 6/1998 | Imai et al. | 438/719 |
| 5,788,799 | 8/1998 | Steger et al. | 156/345 |
| 5,843,239 | 12/1998 | Shrotriya | 134/1.1 |
| 5,866,483 | 2/1999 | Shiau et al. | 438/720 |
| 5,869,401 | 2/1999 | Brunemeier et al. | 438/710 |
| 5,874,363 | 2/1999 | Hoh et al. | 438/721 |
| 5,879,575 | 3/1999 | Tepman et al. | 216/68 |
| 6,090,718 | 7/2000 | Soga et al. | 438/714 |

FOREIGN PATENT DOCUMENTS

| | | |
|---|---|---|
| 0516043 | 12/1992 | (EP) . |
| 0555546 | 8/1993 | (EP) . |
| 0697467 | 2/1996 | (EP) . |
| 0709877 | 5/1996 | (EP) . |
| 0746015 | 12/1996 | (EP) . |
| 0837497 | 4/1998 | (EP) . |
| 01050427 | 2/1989 | (JP) . |
| 6177092 | 6/1994 | (JP) . |
| 7029879 | 1/1995 | (JP) . |
| 1023387 | 9/1998 | (JP) . |
| 9615545 | 5/1996 | (WO) . |

* cited by examiner

PROCESS FOR ETCHING SILICON-CONTAINING MATERIAL ON SUBSTRATES

CROSS-REFERENCE

This application is a continuation-in-part of U.S. patent application Ser. No. 08/969,122, entitled "Self-Cleaning Etch Process," filed on Nov. 12, 1997, which is incorporated herein by reference U.S. Pat. No. 6,136,211.

The present invention relates to a method of etching a silicon-containing layer on a substrate.

BACKGROUND

In the manufacturing of integrated circuits, silicon-containing layers, such as silicon dioxide, silicon nitride, polysilicon, metal silicide, and monocrystalline silicon layers, which are formed on a substrate, and etched to form gates, vias, contact holes, trenches, and/or interconnect lines. In the etching process, a patterned mask layer comprising silicon dioxide, silicon nitride, and/or photoresist, is formed on the substrate using conventional methods, and the exposed portions of the silicon-containing layers on the substrate are etched by microwave or RF energized process gas.

One problem with conventional etching processes arises because it is difficult to etch a surface layer comprising two or more compositionally different regions at the same etch rate. For example, compositionally variant surface layers occur in p-channel and n-channel CMOS transistors fabricated in symmetrical matched pairs, to operate at lower voltages and faster operating speeds. As illustrated in FIG. 1a, a set of matched transistors 10a,b comprises adjacent regions in the semiconductor substrate 45 doped with a dopant, such as boron or phosphorous, to form a p-well 12a and a n-well 12b. Discrete regions of the p-well 12a and n-well 12b are implanted to define the source 16 and drain 18 of the transistors 10a,b. Next, the surface of the substrate 45 overlying the boundary of the p-well 12a and n-well 12b is etched using conventional photolithographic and etching techniques to open a void for an isolation structure 22. A layer of $SiO_2$ is formed on the surface of the substrate 45, to create the isolation structure 22 and an overlying gate oxide layer 175. As shown in FIG. 1b, a layer of polysilicon 170 is grown over the gate oxide layer 175, and doped with different types of dopant, i.e., n-type or p-type, and different concentrations of dopants to form a gate structure 28a,b for each transistor 10a,b. A patterned mask layer 195 is then deposited on the polysilicon layer and it is etched to form the dual gate structures 28a,b, shown in FIG. 1a.

When conventional etching processes are used to etch these types of dual doped polysilicon layers 170, the different regions 180a, 180b are etched at different etch rates. For example, the regions with n-type dopant 180a are typically etched as much as 20% faster than the regions 180b with p-type dopant. Also, doped regions are typically etched at much faster rates than undoped regions, or regions in which the implant has not been diffused or activated by annealing the substrate. This difference in etch rates can lead to residues depositing in the more slowly etched regions and/or excess gate oxide 175 loss in the more rapidly etched regions. Furthermore, conventional etching processes also etch features having unacceptably large variations in profile angles (more than 3 degrees) from one region to another region on the substrate 45. The profile angle is the angle made by a sidewall of the etched features with the plane of the substrate. It is desirable to have an etching process that etches through the compositional variant regions at the substrate surface with uniform etching rates and little or no variations in profile angles of etched features.

In one solution, highly chemically reactive etchant gases are used to etch through layers having varying concentration or composition of dopants at a faster and more uniform etch rates. However, the highly reactive etching gas typically provides little or no etching selectivity relative to the resist layer or underlayer, and typically etches through the underlying layer at the same high etch rate. This is particularly common when the underlayer also contains elemental silicon or silicon compounds. For example, when etching through a polysilicon layer that overlies a thin silicon dioxide gate oxide layer, it is necessary to stop the etching process without etching through the underlayer. Thus there is a need for an etching process gas that provides high and uniform etch rates for compositional variant regions in a polysilicon layer without sacrificing the etching selectivity to an underlayer which also contains silicon species.

Another problem arises because it is difficult to clean or remove the thin film of etchant residue that condenses and deposits on the internal surfaces of the chamber, such as the sidewalls, ceiling, and the surfaces of the internal components in the chamber, during the etching process. The composition of the etchant residue depends on the constituents of the process gas, the vaporized material being etched, and the mask layer on the substrate. For example, when tungsten silicide, polysilicon or other silicon-containing layers are etched, silicon-containing gaseous species are vaporized or sputtered to form a large component of the etchant residue deposits. In addition, the mask layer is also partially vaporized to form gaseous hydrocarbon or oxygen species which condense on the internal surfaces of the process chamber. Thus the etchant residue deposits are typically composed of polymeric byproducts containing hydrocarbon species vaporized from the photoresist in the mask layer, process gas species such as fluorine, chlorine, oxygen, or nitrogen; and vaporized silicon-containing species from the polysilicon layer being etched on the substrate. The chemical composition of the etchant residue deposits can also vary considerably across the chamber surface depending upon the composition of the local gaseous environment, the location of gas inlet and exhaust ports, and the geometry of the chamber.

The etchant residue deposits formed on the chamber surfaces are periodically cleaned to prevent contamination of the substrate 45. Typically, after processing of about 25 substrates, an in-situ plasma "dry-clean" process is used to dry clean the surfaces of the chamber. However, conventional cleaning plasmas that etch the etchant residue deposits contain highly energetic plasma species that rapidly erode the chamber walls and chamber components, and it is expensive to often replace such parts and components. Moreover, after processing of multiple substrates, the etching chamber is opened to the atmosphere and a "wet-cleaning" process is performed in which an operator uses an acid or solvent to scrub off and dissolve accumulated etchant residue deposits on the internal chamber surfaces. After the wet cleaning step, the chamber is "seasoned" by pumping down the chamber to a vacuum environment for 2 to 3 hours to allow moisture and other trapped volatile species to outgas. Thereafter, the etch process to be performed in the chamber, is run for 10 to 15 minutes on a series of dummy wafers until the chamber provides consistent and reproducible etching properties. In the competitive semiconductor industry, the increased cost per substrate and downtime of the chamber, during the dry cleaning, wet cleaning, and seasoning steps is highly undesirable. Also, the cleaning process often provides inconsistent and variable etching properties, because the wet cleaning process is manually performed by an operator.

Thus it is desirable to have an etching process that etches silicon-containing layers having different dopant concentrations at uniform etch rates, and with high etching selectivity to an underlayer. It is especially desirable for the etch process to etch polysilicon layers containing dual-doped or doped/undoped regions with uniform and consistent etch rates. It is also desirable for the etching process to clean-off etchant residue deposits formed on the internal surfaces of the chamber without excessive erosion of the chamber surfaces.

SUMMARY

The present invention provides a method of etching a polysilicon layer on a substrate. In the method, the substrate is placed in a process chamber, and exposed to an energized process gas comprising a bromine-containing gas, a chlorine-containing gas, an inorganic fluorinated gas, and an oxygen gas.

In another aspect, the process of the present invention is directed to a method for etching a polysilicon layer on a substrate while simultaneously cleaning internal surfaces of a process chamber. The method comprising the steps of, placing the substrate in the process chamber and exposing the substrate and the internal surfaces of the process chamber to an energized process gas. The energized process gas comprising a bromine-containing gas selected from the group consisting of HBr, $Br_2$, and $CH_3Br$; a chlorine-containing gas selected from the group consisting of $Cl_2$ and HCl; an inorganic fluorinated gas selected from the group consisting of $NF_3$, $CF_4$, and $SF_6$; and an oxygen gas selected from the group consisting of $O_2$ and $He-O_2$.

In yet another aspect, the process of the present invention is directed to a method for etching a polysilicon layer on a substrate while simultaneously cleaning internal surfaces of a process chamber, in which the polysilicon layer has a first region with a first dopant concentration and a second region with a second dopant concentration. In the method, the polysilicon layer on the substrate and the internal surfaces of the process chamber to an energized process gas comprising a bromine-containing gas selected from the group consisting of HBr, $Br_2$, and $CH_3Br$; a chlorine-containing gas selected from the group consisting of $Cl_2$ and HCl; an inorganic fluorinated gas selected from the group consisting of $NF_3$, $CF_4$, and $SF_6$; and an oxygen gas selected from the group consisting of $O_2$ and $He-O_2$. The volumetric flow ratio of the combined volumetric flow rates of the bromine-containing gas, chlorine-containing gas, and oxygen gas, to the volumetric flow rate of the inorganic fluorinated gas is selected to etch the first and second regions at etching rates that differ by less than about 10%.

In still another aspect, the process of the present invention is directed to a multi-stage process for etching a silicon-containing layer on a substrate while simultaneously cleaning internal surfaces of a process chamber. In the method, the substrate having the silicon-containing layer is placed in the process chamber, and in a first etching stage, an energized first process gas is provided in the process chamber. The first process gas comprising etching gas for etching the silicon-containing layer on the substrate, and cleaning gas for cleaning deposits formed on the internal surfaces of the process chamber during etching of the silicon-containing layer. Next, in a pump-out stage, the flow of the first process gas is stopped and the first process gas is exhausted from the process chamber. Then in a second etching stage, an energized second process gas comprising etching gas for etching the silicon-containing layer is provided in the process chamber, the energized second process gas being substantially absent cleaning gas. Also, the second process gas has a higher selectivity to the underlying gate oxide layer thereby reducing gate oxide loss.

DRAWINGS

These and other features, aspects, and advantages of this invention will be better understood from the following drawings and description, which illustrate and describe examples performed according to the process of the present invention.

Figure 7:
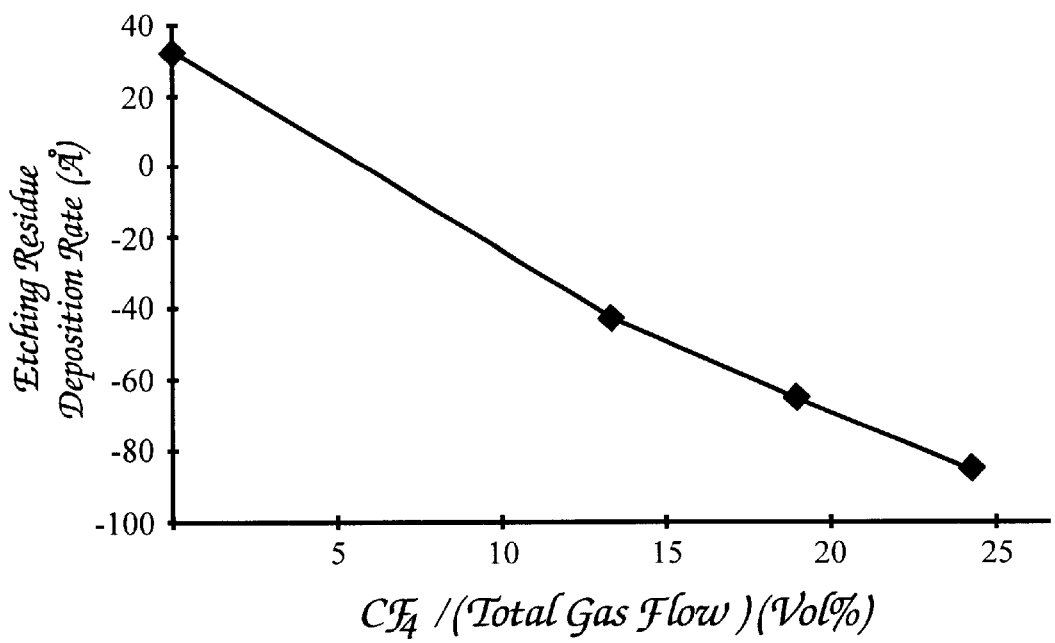
Figure 8:
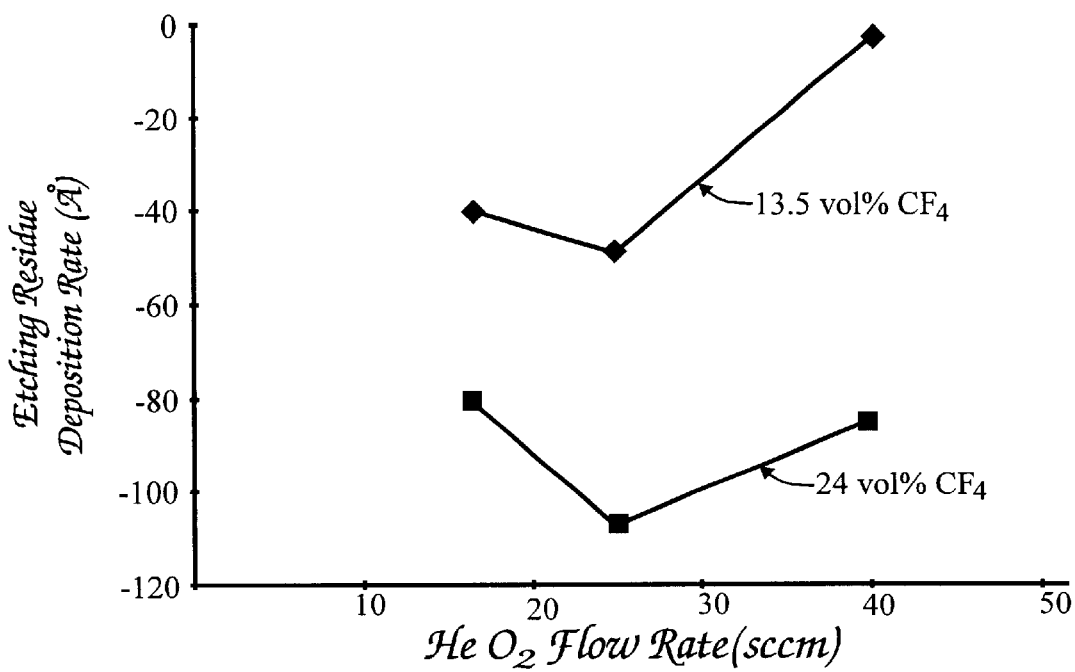

FIG. 7 is a graph showing the reduction in deposition of etchant residue on the internal surfaces of the process chamber (as measured by a quartz crystal microbalance) for increasing volumetric flow ratio of inorganic fluorinated gas in the process gas; and FIG. 8 is a graph showing the change in etchant residue deposition rate on the internal surfaces of the process chamber for increasing volumetric flow ratio of $CF_4$ and $He-O_2$ in the process gas.

DESCRIPTION

Figure 2:
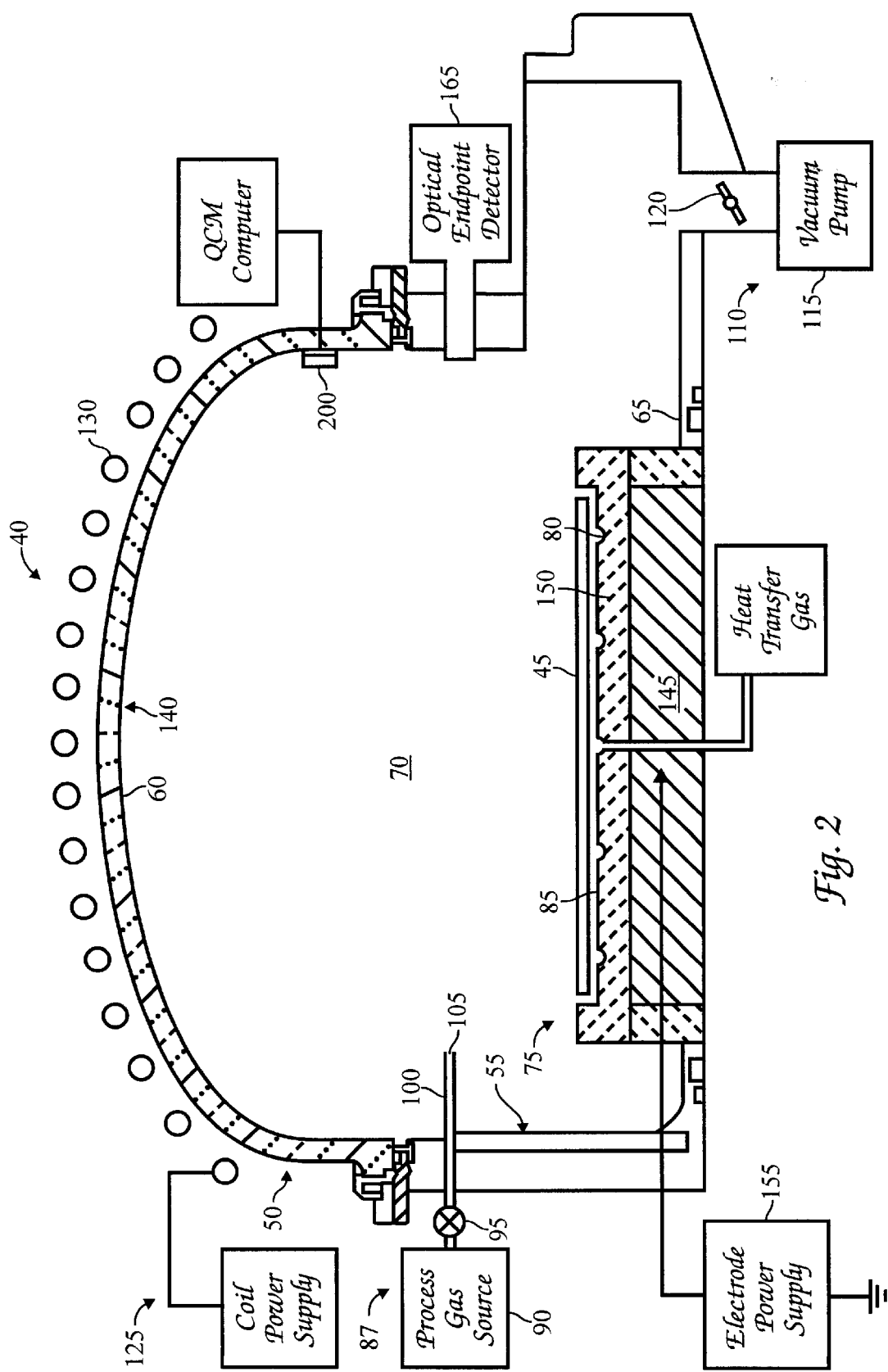
FIG. 2 is a sectional schematic side view of an apparatus suitable for practicing the process of the present invention.

An apparatus 40 suitable for etching a substrate 45 according to the present invention, as schematically illustrated in FIG. 2, comprises an enclosed process chamber 50 for processing the substrate. The particular embodiment of the apparatus 40 shown herein is suitable for processing of semiconductor substrates 45, is provided only to illustrate the invention, and should not be used to limit the scope of the invention. The enclosed chamber 50 has sidewalls 55, a ceiling 60, and a bottom wall 65 fabricated from any one of a variety of materials including metals, ceramics, glasses, polymers, and composite materials. A process zone 70 defined in the process chamber 50 is directly above and surrounds the substrate 45, and comprises a volume of at least about 10,000 $cm^3$, and more preferably about 10,000 to about 50,000 cm³. The ceiling 60 can be flat, arcuate, conical, dome-shaped, or multiradius dome shaped. Preferably, the ceiling 60 is dome-shaped to provide a uniform distribution of energized process gas across the entire volume of the process zone 70. This is because the dome-shaped ceiling 60 is further from the substrate 45 than a flat ceiling, thereby reducing dissociated ion recombination losses near the substrate 45 to provide more uniform ion density across the surface of the substrate 45 than a flat ceiling. The dome ceiling 60 can be a flattened dome, conical, truncated conical, cylindrical, or other combination of such shapes, that provides a dome shaped surface above the substrate 45.

A support 75 having a receiving surface 85 for receiving a substrate 45 thereon is positioned in the process zone 70. Preferably, the receiving surface 85 comprises grooves 80 that are sized and distributed to hold heat transfer gas such that substantially the entire surface of the substrate 45 is uniformly heated or cooled. Typically, the heat transfer gas contained in the grooves 80 comprises helium or argon which is supplied at a pressure of about 5 to about 30 Torr.

The process gas is introduced into the process chamber 50 through a gas distribution system 87 that includes a process gas source 90, a gas flow control valve 95, and a process gas distributor 100. The process gas distributor 100 can comprise gas outlets 105 located peripherally around the substrate 45 (as shown), or a showerhead mounted on the ceiling 60 of the chamber 50 with outlets therein (not shown). Spent process gas and etchant byproducts are exhausted from the process chamber 50 through an exhaust system 110 including a vacuum pump 115 (typically a 1000 liter/sec roughing pump) capable of achieving a minimum pressure of about $10^{-3}$ mTorr in the process chamber 50. A throttle valve 120 is provided in the exhaust 110 to control the flow of spent process gas and the pressure of process gas in the chamber 50.

Process gas is energized using a gas energizer 125 to form an energized process gas or a plasma before or after introduction into the process chamber 50. A suitable gas energizer 125 comprises one or more inductor coils 130 having a circular symmetry with a central axis coincident with the longitudinal vertical axis that extends through the center of the process chamber 50 and perpendicular to the plane of the substrate 45. Preferably, the inductor coils 130 comprises solenoid coils having from 1 to 10 turns, and more typically from 2 to 6 turns. The arrangement and number of inductor coils 130 is selected to provide the desired product of current and antenna turns (d/dt)(N·I) near the ceiling 60 to provide a strong inductive flux linkage with close coupling to the energized process gas and therefore greater ion density in the process zone 70 adjacent to the substrate 45. When the inductor coils 130 are positioned near the dome ceiling 60, the ceiling of the process chamber 50 comprises a dielectric material which is transparent to RF fields, such as a slab of machined silicon dioxide, or tiles of silicon or silicon dioxide bonded to one another to provide a curved shape. Preferably, the inductor coils 130 wrap around the sidewall 55 of the process chamber 50 to form a "flattened" or multiradius dome-shaped that provides increased ion density directly over the substrate 45 because ion density is affected by local ionization near the inductor coil 130, and a multi-radius inductor coil is closer to the substrate 45 than a hemispherical coil.

In addition to the inductor coils 130, one or more process electrodes can be used to accelerate the energized process gas ions in the process chamber 50. The process electrodes typically include a cathode electrode 145 in or below the support 75, and a conducting portion of a wall of the process chamber 50, such as the ceiling 60 and/or sidewalls 55, which serves as an anode electrode 140. In a preferred embodiment, the cathode electrode 145 is embedded in a dielectric member 150 positioned on the support 75 to serve as an electrostatic member for electrostatically holding the substrate 45 to the support 75. An electrode voltage supply 155 supplies a RF potential to the cathode electrode 145 that maintains the anode and cathode electrodes 140, 145 at different electrical potentials relative to one another. Alternatively, the gas energizer 125 can also comprise a microwave or other source of ionizing radiation (not shown) capable of energizing the process gas before or after injection into the process chamber 50.

The energized process gas in the process zone 70 can also be enhanced using magnetically enhanced reactors, in which a magnetic field generator (not shown), such as a permanent magnet or electromagnetic coils, are used to apply a magnetic field in the process zone 70 to increase the density and uniformity of the energized process gas. Preferably, the magnetic field comprises a rotating magnetic field with the axis of the field rotating parallel to the plane of the substrate 45, as described in U.S. Pat. No. 4,842,683, issued Jun. 27, 1989, which is incorporated herein by reference. The magnetic field in the process chamber 50 should be sufficiently strong to increase the density of the ions formed in the energized process gas, and sufficiently uniform to reduce charge-up damage to features such as CMOS gates. Generally, the magnetic field as measured on the surface of the substrate 45 is less than about 500 Gauss, more typically from about 10 to about 100 Gauss, and most typically from about 10 Gauss to about 30 Gauss.

A process monitoring system, such as an optical endpoint detector 165, can be used to monitor the process being conducted in the process chamber 50 and determine completion of the etching process for a specific layer. Suitable optical endpoint detectors 165 include detectors based on optical emission, ellipsometry, and interferometry. Optical emission detectors detect the spectral lines in a light spectra emitted by chemically active radicals in the energized process gas to detect changes in chemistry that would indicate the beginning of etching of an underlying layer. Ellipsometers project a light beam at an acute angle to the surface of the substrate 45 to detect a phase shift between portions of the light beam reflected off the top and bottom surfaces of a transparent film on the substrate 45. An interferometer also reflects a beam of light off the top and the bottom surface of a transparent layer on the substrate 45; however, an interferometer determines the thickness of a film on the substrate 45, by measuring the magnitude of constructive or destructive interference between the reflected light beams.

During the etching process a thin film of etchant residue condenses or deposits on the internal surfaces of the process chamber 50, such as the sidewalls 55, ceiling 60, and the surfaces of the internal components in the process chamber 50. The composition of the etchant residue deposits depends on the composition of vaporized species and process gas, the substrate material being etched, and the mask or resist layer on the substrate 45. For example, when polysilicon or other silicon-containing layers are etched, silicon-containing gaseous species are vaporized or sputtered to form a large component of the etchant residue deposits. In addition, the photoresist or mask layer is also partially vaporized to form gaseous hydrocarbon or oxygen species. Thus the etchant residue deposits are typically composed of polymeric byproducts containing hydrocarbon species vaporized from the photoresist layer, process gas species such as fluorine, chlorine, oxygen, or nitrogen; and silicon species from the layer being etched on the substrate 45. These etchant residue deposits can flake off during operation of the process chamber 50 and contaminate the substrate 45, or can alter the characteristics of the surfaces on which they are deposited, thereby reducing process uniformity. This is particularly a problem for process chamber surfaces and components comprising ceramic materials, such as aluminum oxide, aluminum nitride, silicon, or silicon oxide, which have highly reactive surface functional groups that are necessary for proper functioning of the process chamber 50.

Etching Process

Figure 1A:
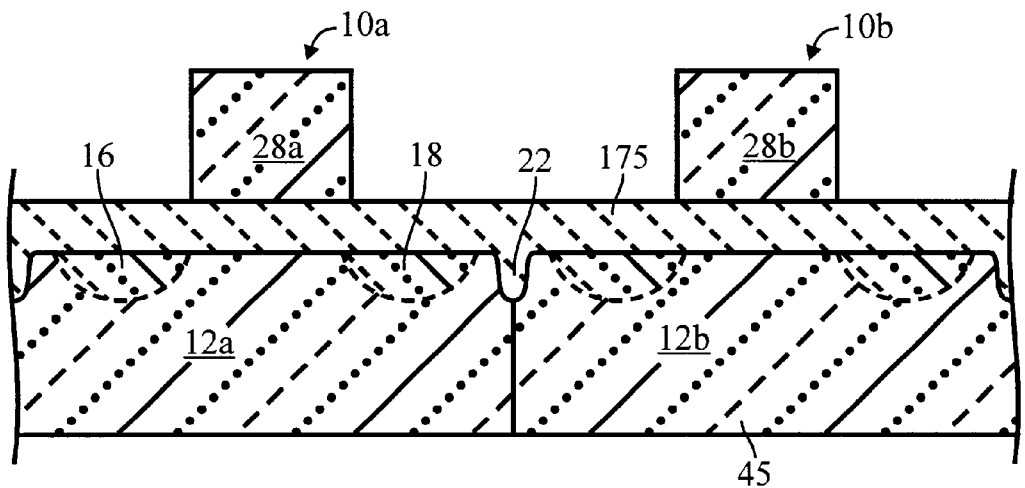
FIG. 1a (prior art) is a schematic cross-section of a substrate comprising symmetric CMOS transistors having a dual gate structure.
Figure 1B:
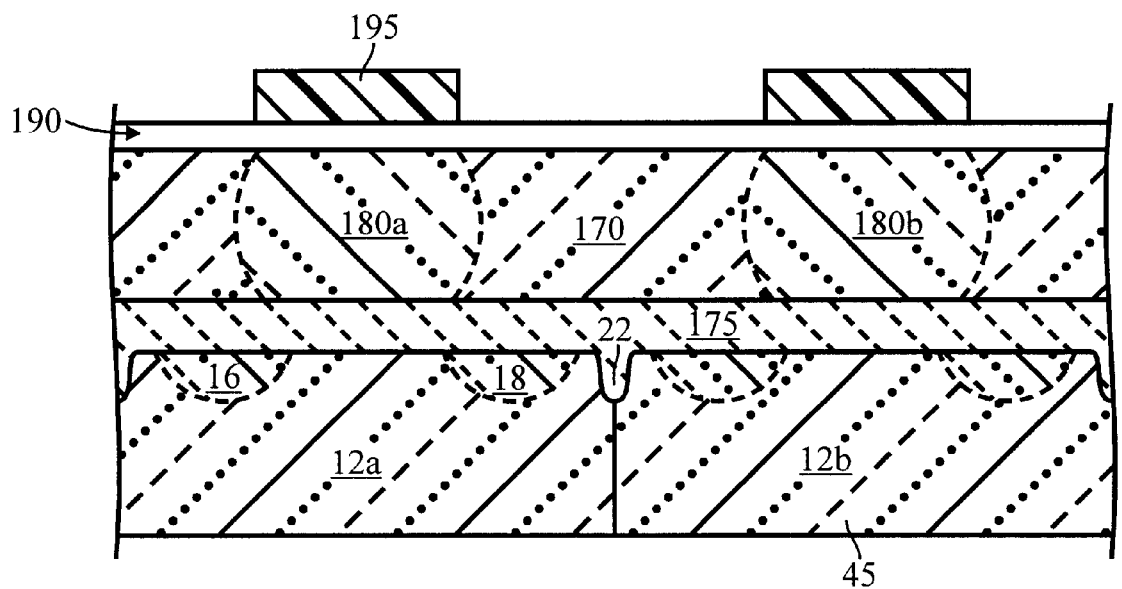
FIG. 1b (prior art) is a schematic cross-section of a substrate comprising a polysilicon layer with first and second regions having different compositions of dopants, an underlayer of silicon dioxide, and overlying anti-reflective and resist layers.

Operation of the process chamber 50 to etch a substrate 45 comprising one or more of silicon-containing layers having different concentrations or compositions of dopant will now be described. The substrate 45 typically comprises a semiconductor material, such as a silicon or gallium arsenide wafer, with a plurality of layers, as shown in FIG. 1b. For example, the substrate 45 can include a polysilicon layer 170 comprising first and second regions 180a,b having different concentrations or compositions of dopants, such as boron or phosphorous. Alternatively, the substrate 45 can comprise a polysilicon layer 170 having a first doped region 180a, and a second lightly doped or undoped region 180b, or a region in which the dopant has not been activated by heating the substrate 45 to diffuse the dopant material throughout the region 180b. In addition, the substrate 45 can also comprise an anti-reflective layer 190 covering the polysilicon layer 170 to reduce reflection during patterning of an overlying photosensitive resist layer 195. The resist layer 195 is deposited on the substrate 45, and patterned using conventional photolithographic techniques. The exposed portions of the substrate 45 between patterned features on the resist layer 195 are then etched by the process of the present invention to form features, such as for example, dual-gate structures 28a,b as shown in FIG. 1a.

To perform the process of the present invention, the substrate is placed on the support 75 in the process chamber 50, and the process chamber evacuated. A process gas is introduced into the process chamber 50 through the process gas distributor 100, and the throttle valve 120 and/or process gas flow control valve 95 adjusted to maintain pressure in the process chamber 50. Power is applied to the gas energizer 125 to form an energized process gas to process the substrate 45. Typically, the power level of the RF current applied to the inductor coils 130, or source power, determines the amount of dissociated species in the energized process gas. Thus increasing the source power provides more dissociated species and therefore a more rapid albeit a more isotropic etch. In contrast, increasing the power level of the RF voltage applied to the cathode electrode 145, or bias power, increases the degree of anisotropic etching by providing a higher kinetic bombardment energy component to the energized process gas. For etching a polysilicon layer 170 comprising regions having different composition or concentrations of dopant, a preferred ratio of source power to bias power $P_r$ is from about 1:0.1 to about 100:1. More preferably, the process gas is energized by applying a source power level of about 200 to about 2000 Watts, and a bias power level of about 5 to 500 Watts. The frequency of the RF voltage applied to the cathode electrode 145 and/or inductor coils is typically from about 50 KHz to about 60 MHZ, and more typically about 13.56 MHZ.

A significant advantage of the process of the present invention is that it etches one or more silicon-containing layers that have different concentrations or compositions of dopant at the same etching rate. The process gas comprises an etching gas including a bromine-containing gas, a chlorine-containing gas, an oxygen-containing gas such as for example an oxygen gas, and a fluorine-containing gas such as for example an inorganic fluorinated gas. It has been discovered that this combination of gases provides unique and unexpectedly uniform etching rate across a silicon-containing layer having regions with different concentrations or compositions of dopant. Moreover, the process gas composition also significantly reduces the differences in profile angles obtained for features that are etched in regions of the polysilicon layer 170 that have different concentrations of dopant. Furthermore, it has been discovered that the process gas also serves as a cleaning gas that removes etchant residue deposits from the internal surfaces of the process chamber 50.

The bromine-containing gas of the process gas enhances the rate of etching of a silicon-containing layer, such as the polysilicon layer 170, while simultaneously reducing the rate of etching of the resist layer 195 thereby enhancing the etching selectivity ratio of the silicon-containing layer 170 to the resist layer 195. It is believed the bromine in the bromine-containing gas reacts with Si in the silicon containing layer to form a sidewall passivation layer and does not react with resist as aggressively as $Cl_2$ thereby reducing erosion of the resist layer 195. The bromine-containing gas can comprise HBr, or can comprise other bromine-containing gases that are equivalent to HBr, for example, $Br_2$, $CH_3Br$, and mixtures thereof. For etching polysilicon, HBr is preferred because it provides more sidewall passivation deposits for more anisotropic etching.

The chlorine-containing gas functions as the main etchant for etching the silicon-containing layer 170 on the substrate 45. The chlorine-containing gas is ionized to form atomic chlorine and chlorine-containing species that etch the silicon-containing layer 170 on the substrate 45. For example, silicon in the polysilicon layer 170 can be etched by chlorine-containing ions and neutrals to form volatile $SiCl_x$ species that are exhausted from the process chamber 50. The chlorine-containing gas can comprise $C_2$, or can comprise other chlorine-containing gases that are equivalent to chlorine, for example, HCl, $BCl_3$, and mixtures thereof. For etching polysilicon, $Cl_2$ is preferred because it has a high etch rate for etching silicon.

The oxygen gas is provided to increase the etching selectivity ratio of etching polysilicon relative to silicon dioxide. It is believed that the oxygen gas ionizes to form ions and excited radicals of atomic oxygen and oxygen-containing species that enhance the rate of etching of the polysilicon layer 170, while simultaneously reducing the rate of etching of the silicon dioxide layer 175. The oxygen gas can also comprise an oxygen compound which includes inert gases, such as for example, helium, xenon, argon, or krypton. For etching polysilicon, He—$O_2$ gas is preferred because the helium gas serves as a diluent gas that reduces the residence time of the process gas in the process chamber 50. In addition, He—$O_2$ gas serves to add very small volumes of oxygen to the process gas.

The volumetric flow ratios of chlorine-containing gas to bromine-containing gas are selected to etch the silicon-containing layer faster than the resist layer 195 and the silicon dioxide layer 175. Preferably, the silicon-containing layer is etched at an etch rate of at least about 2000 Å/min, and more preferably, the silicon-containing layer is etched at an etch rate of about 3000 Å/min an etching selectivity ratio of at least about 2:1. The volumetric flow ratio of chlorine-containing gas to bromine-containing gas is also selected to provide anisotropically etched features having sidewalls with smooth surfaces that form angles of at least about 88° with a plane of the substrate 45, and more preferable angles of from about 89° to about 90°. If the volumetric flow rate of chlorine-containing gas is too high, or the total volumetric flow rate of other gases too low, the etch rate is too rapid. A rapid etch rate exceeding the rate at which passivation deposits are formed results in an isotropic etch that provides features having undercut sidewall profiles. Preferably, the volumetric flow ratio of chlorine-containing gas to bromine-containing gas is from about 1:5 to about 5:1, and more preferably about 1:1.

The volumetric flow ratio of oxygen gas to chlorine-containing gas and bromine-containing gas is selected to provide a substantially anisotropic etch of the silicon-containing layer 170, and to provide good selectivity relative to silicon dioxide when etching a polysilicon layer 170. The flow of oxygen gas should be sufficient to prevent the accumulation of passivating deposits from reducing the etch rate. However, excessively high flow rates of oxygen gas can also cause more isotropic etching of the substrate 45 by removing the passivating deposits formed on the etched features too quickly. Thus, the flow rate of the oxygen gas is maintained lower than the flow rate of the chlorine-containing gas to provide sufficient chlorine-containing species to rapidly etch the substrate 45, while providing a high polysilicon to silicon dioxide etching selectivity and more anisotropic etching. Preferably, when a premixed mixture of He—$O_2$ having about 3 parts helium to 1 part oxygen is used, the volumetric flow ratio of He—$O_2$ gas to chlorine-containing gas is at least about 1:20, and more preferably from about 1:3 to about 1:13.

The ratio of the inorganic fluorinated gas to the other gas constituents controls many of the unexpected features of the present process. For example, the volumetric flow ratio of the inorganic fluorinated gas to the combined flow rates of the bromine-containing gas, chlorine-containing gas, and oxygen gas, controls the rate of etching regions on the silicon-containing layer that have different compositions and concentrations of dopants to provide etching rates that differ by less than 10%, and more preferably, are substantially the same. The addition of inorganic fluorinated gas significantly enhances the control of the profile angle of the etched features of the polysilicon layer 170. The ratio of volumetric flow rate of the inorganic fluorinated gas to the combined flow rates of other process gases also controls the rate of removal of etchant residue, and can remove residues generated from processing 2000 to 3000 substrates 45, without stopping the etching process for a wet clean operation. It has been discovered that a suitable volumetric flow ratio of the combined volumetric flow rates of the bromine-containing gas, chlorine-containing gas, and oxygen gas, to the volumetric flow rate of the inorganic fluorinated gas is from about 4:1 to about 20:1 and more preferably is from about 5:1 to about 10:1.

The process gas composition described above has been discovered to provide numerous advantages over process gas compositions for etching silicon-containing layers. The process gas composition of the present invention provides uniform and consistent etching rates for etching a silicon-containing layer having regions of different concentration/composition of dopant, providing etching rate variations of as low as 10% is in contrast to conventional gas composition that typically provide etching rates more than 25%. In addition, this process gas composition provides etched features having profile angles of 88 to 90° for the etched features of both the doped and undoped polysilicon. The profile angle, i.e., the angle between the sidewall of the etched feature and the plane of the substrate 45, is ideally about 90° to provide features having straight and substantially perpendicular sidewalls. Features having straight sidewalls can be formed closer together leading to higher circuit densities and faster operating speeds. However, conventional etching processes often result in a profile difference of greater than 3° between doped and undoped regions or n-doped and p-doped regions. Moreover, the deposition of etchant residue on the internal surfaces of the process chamber 50 drops from a rate of over 30 Å/min with conventional etching process gas compositions, to a removal rate of over 40 Å/min.

In a preferred embodiment of the present process, multiple stages are used to completely etch through a polysilicon layer 170 having different concentrations or compositions of dopant without etching through the thin underlying silicon dioxide layer 175. In addition, inorganic fluorinated gas is introduced in at least one of the stages to remove the etchant residue deposits on the process chamber surfaces. In a first or main etching stage, most of the thickness of the polysilicon layer 170 that are exposed through openings in the resist layer 195 is etched. The process gas comprises an etching gas comprising $Cl_2$, HBr, and He—$O_2$, and an inorganic fluorinated cleaning gas, such as $CF_4$, or $NF_3$, in volumetric flow ratios suitable for etching the polysilicon layer 170 with a high etch rate and a high selectivity ratio relative to the resist layer 195. A suitable volumetric flow ratio of inorganic fluorinated gas to total volumetric flow ratio is about 0.15:1. The source power applied to the inductor coils 130 is about 500 watts, and the bias power applied to the cathode electrode 145 is about 80 watts. The process chamber pressure is about 4 mTorr, and the substrate is maintained at a temperature of about 50° C. by supplying helium to the grooves 80 at a pressure of about 8 Torr. Preferably, the main etch stage provides a polysilicon etch rate of from about 1800 Å/min to about 2500 Å/min, and an etching selectivity ratio relative to silicon dioxide of from about 3:1 to about 7:1.

The main etch stage is stopped by the optical endpoint detector 165, immediately before the polysilicon layer 170 is completely etched through. A suitable endpoint detection method is optical emission analysis in which an emission spectra of the energized process gas in the process chamber 50 is analyzed to determine a change in chemical composition that corresponds to a change in the chemical composition of the layer being etched, as taught in U.S. Pat. No. 4,328,068 which is incorporated herein by reference.

A pump-out step is performed after the main etch stage is stopped, to exhaust the process gas of the main etch stage from the process chamber 50, and in particular to remove substantially all of the inorganic fluorinated gas. The inorganic fluorinated gas is a chemically aggressive gas that would rapidly etch through the thin underlying silicon dioxide layer 175, and its removal is needed to preserve the silicon dioxide layer 175. In the pump-out step, the process chamber 50 is pumped down to a pressure sufficiently low, and for a sufficient time to ensure that substantially all of the inorganic fluorinated gas is removed from the process zone 70. Preferably, the chamber 50 is evacuated to a pressure of from about 0.5 mTorr to about 1 mTorr. More preferably the process chamber 50 is maintained at a pressure of less than about 0.5 mTorr for from about 5 to about 15 seconds, to ensure that substantially all of the inorganic fluorinated gas is removed from the process zone 70. Optionally, a low flow of an inert purge gas, such as nitrogen, may be introduced during the pump-out stage to dilute any remaining inorganic fluorinated gas in the chamber 50 and to prevent backstreaming of oil from the vacuum pump 115. A suitable flow rate is from about 50 to about 100 sccm.

After the pump-out step, a second or overetch stage is performed in which the portion of the polysilicon layer remaining on the substrate is etched. In the overetch stage, a second process gas, which is substantially absent inorganic fluorinated gas, is energized by the gas energizer 125. For example, the overetch stage can comprise a process gas including 160 sccm HBr and 10 sccm He—$O_2$; a process chamber pressure of 50 mTorr; a source power level of 1000 Watts; and a RF bias power level of 100 Watts. More preferably, the process gas composition of the overetch stage is selected to provide a polysilicon etch rate of from about 1500 Å/min to about 3000 Å/min, and an etching selectivity ratio relative to silicon dioxide of from about 50:1 to about 150:1.

In addition to uniform etching through polysilicon layers 170 having different concentrations/compositions of dopant, the etching process of the present invention has been found to clean and remove etchant residue deposited on surfaces of the process chamber 50 during the etching process, irrespective of the thickness or chemical stoichiometry of the etchant residue deposits. Prior art etching processes required cleaning and conditioning of the process chamber 50 after processing of only 200 to 300 substrates 45, because amount of etchant residue deposits on the chamber surfaces, after processing this number of substrates 45. Build-up of etchant deposits resulted in flaking off and contamination of the substrate 45. Also, prior art cleaning processes, particularly those performed by an operator, often fail to uniformly clean and remove the etchant residue deposits formed on process chamber surfaces. Furthermore, the activated cleaning gas can be used to efficiently clean the process chamber 50 in-situ during etching of substrates 45, rather than stopping processing to wet clean the process chamber walls and components, thereby increasing etching throughput and further reducing costs per substrate 45. In contrast, the process of the present invention removes the etchant residue deposits formed across substantially all of the process chamber surfaces, to reduce substrate contamination and increase yields. A process gas comprising the cleaning gas also results in much less erosive damage to the process chamber 50 compared to conventional in-situ plasma cleaning steps, because of the reduced energy levels of the energized process gas in the process chamber 50. This was difficult to accomplish in prior art processes, in which the high powered plasmas needed to remove the accumulated etchant residue deposits often resulted in extensive erosion of chamber surfaces and components. By reducing the need to replace process chamber components, the cost of operating the process chamber 50 and the cost per substrate 45 are significantly reduced. The etching process is expected to increase process chamber 50 lifetimes by a factor of at least 2.

EXAMPLES

The following examples illustrate use of the present invention for etching polysilicon layers 170 on semiconductor substrates 45 and cleaning etchant residue deposits off the internal surfaces of the process chamber 50. However, the apparatus 40 and method can be used in other applications as would be apparent to those skilled in the art, and the scope of the present invention should not be limited to the illustrative examples provided herein.

In these examples, the process of the present invention was used to etch a polysilicon layer 170 on a substrate 45 to expose a thin underlayer of silicon dioxide 175. The polysilicon layer 170 comprised first and second regions 180a,b having different concentrations or compositions of dopants, including undoped regions or regions in which the dopant has not been activated. The substrates 45 were silicon wafers having a diameter of 200 mm, and comprising a polysilicon layer 170 2500 Å thick over an underlayer of silicon dioxide 175 45 Å thick, and an overlying BARC anti-reflective layer 190 700 Å thick. A resist layer 195 comprising an 8000 Å thick layer of a deep ultra-violet DUV resist was deposited on the anti-reflective layer 190 and patterned using conventional techniques. The substrates 45 were etched according to the process of the present invention, and after the etching process, measurements were made to determine the thickness of the polysilicon layer 170 removed, the thickness of the silicon dioxide layer 175 remaining, the etching rate, the etching uniformity, and the etching selectivity of the polysilicon layer 170 relative to the overlying resist layer 195 and underlaying silicon dioxide layer 175. The uniformity of the doped and undoped polysilicon etching rates was determined from (maximum etch rate−minimum etch rate)/(2× average etch rate)×100%. The etching rates were measured from by partially etching the polysilicon layer 170 and measuring the remaining polysilicon with an interferometer, such as a Prometrix UV 1050.

In addition, the process gas composition was tailored to clean or prevent deposition of excessive etchant residue on the internal surfaces of the process chamber 50. A quartz crystal microbalance (QCM) 200 was used to determine the amount of etchant residue deposits and other process gas byproducts that were being deposited on the process chamber surface during the etching process. The quartz crystal microbalance 200 comprised a piezoelectric plate that changed in capacitance when a film of etchant residue is deposited on the plate. The microbalance 200 was mounted on an internal surface of the process chamber 50, such as a sidewall 55, and its leads connected to a computer outside the process chamber 50.

In these examples, the process gas composition for etching the polysilicon layer 170 was changed by adding increasing amounts of inorganic fluorinated gas, such as $CF_4$, in the main polysilicon etching step. After etching the BARC layer 190, two successive polysilicon etching stages were used to etch the polysilicon layer 170. The first or main etching stage used a more chemically reactive process gas containing inorganic fluorinated cleaning gas, such as $CF_4$, and in the second stage, the process gas was substantially absent the inorganic fluorinated gas to provide a less chemically reactive etching process.

The constant values of process conditions for the main etching stage, included a process gas comprising 60 sccm $Cl_2$, 100 HBr sccm, and 16 sccm He—$O_2$. The volume % $CF_4$ gas was varied between 0%, 13.5%, 19% and 26.3% of the total gas flow. The pressure in the process chamber 50 was maintained at 4 mTorr, the RF source power applied to the inductor coil 130 was 475 Watts, and the RF bias power applied to the cathode electrode 145 was 80 watts. During the process, the substrate 45 was cooled to a temperature of 50° C. using a flow of helium on the backside of the substrate 45 maintained at a pressure of about 8 Torr.

Figure 3:
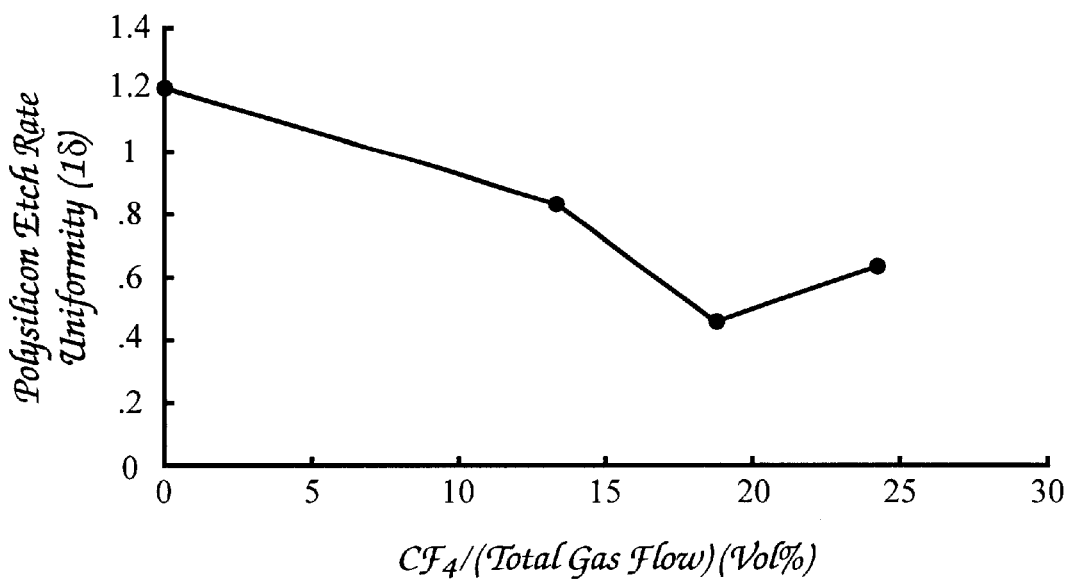
FIG. 3 is a graph showing the polysilicon etching rate uniformity for increasing volumetric flow ratio of inorganic fluorinated gas in the process gas.

The process gas compositions provided uniform and consistent etching rates for etching the polysilicon layer 170 across the entire substrate surface. For example, FIG. 3 shows the polysilicon etching rate uniformity (at one sigma standard deviation) for increasing volumetric flow ratio concentration of inorganic fluorinated gas in the process gas composition. As the volumetric flow ratio of $CF_4$ increased from 0 to 19%, the uniformity of etching the polysilicon layer 170 gradually decreased from 1.2 to 0.4, and thereafter, when the $CF_4$ concentration was 24 volume % the polysilicon etching rate uniformity increased to about 0.6. This etching uniformity factor is 1 to 2 times better than that provided by conventional etching processes.

Figure 4:
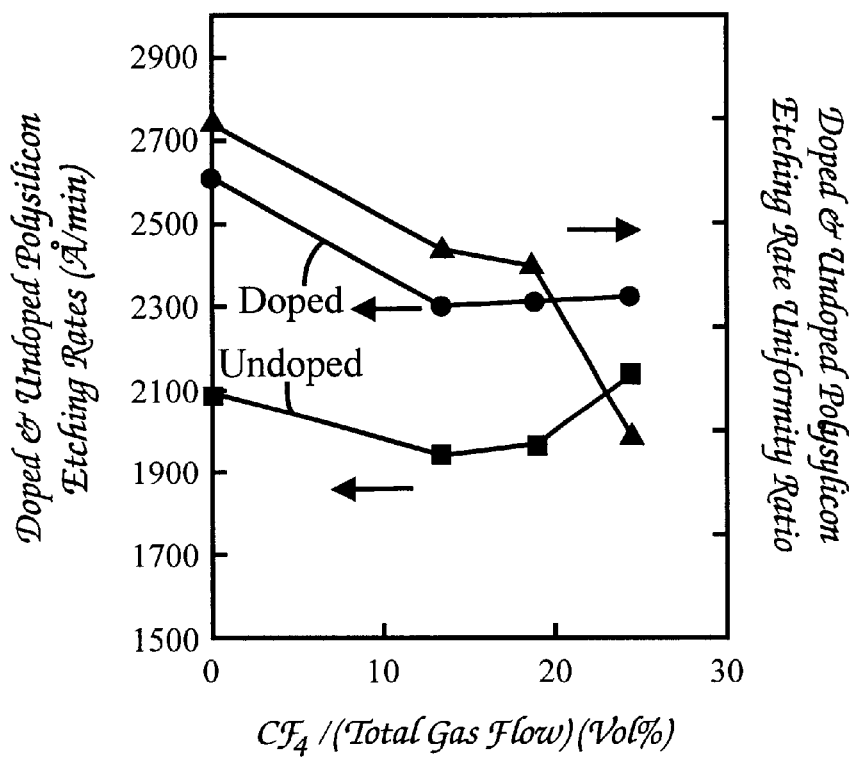
FIG. 4 is a graph showing the etching rate and etching rate uniformity of doped and undoped polysilicon for increasing volumetric flow ratio of inorganic fluorinated gas in the process gas.

FIG. 4 shows the etching rates of doped polysilicon and undoped polysilicon, and the ratio of the etching rate of doped and undoped polysilicon, for increasing volumetric flow ratio of inorganic fluorinated gas. The etching rate for the doped polysilicon gradually decreased from about 2600 Å/min at 0 volume % $CF_4$ to about 2300 Å/min at a 13.5 volume % $CF_4$, and thereafter remained constant for increasing $CF_4$ concentrations. Surprisingly, in contrast to the expectation from the change of etching rates of the doped polysilicon, the etching rate for the undoped polysilicon initially decreased from about 2100 Å/min at 0 volume % $CF_4$ to about 1900 Å/min at a 13.5 volume % $CF_4$, but thereafter, gradually increased back to 2100 Å/min for increasing $CF_4$ concentrations of up to 24 volume %.

Prior art etching processes resulted in significant variations in etching rates of doped and undoped polysilicon across the surface of the substrate 45. In contrast, a process gas composition according to the present invention provides unexpectedly uniform and high etching rates for etching both the doped and undoped polysilicon across the surface of the substrate 45 because the etching rate for the doped polysilicon decreases as the etching rate of the undoped polysilicon is increased. As shown in FIG. 4, this effect causes the ratio (or uniformity) of the doped polysilicon etch rate to the undoped polysilicon etch rate to drop down from 1.25 to about 1.1 for as the volume % of $CF_4$ is increased from 0 to 24 volume %. The uniformity of etching rates for the doped and undoped polysilicon layer 170 of as low as 1.1 is in contrast to conventional etching rate variations that are typically greater than 1.25, as demonstrated herein.

Figure 5:
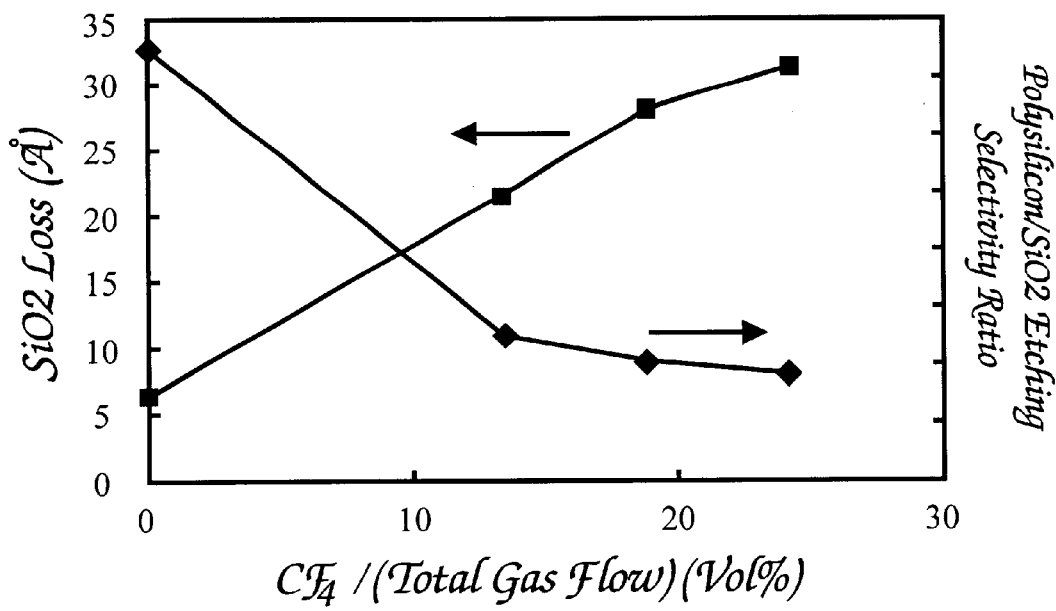
FIG. 5 is a graph showing the loss of underlying silicon dioxide, and the etching selectivity ratio of etching polysilicon relative to underlying silicon dioxide, for increasing volumetric flow ratio of inorganic fluorinated gas in the process gas.

The process gas composition was also selected to provide a high etching selectivity ratio for etching the polysilicon layer 170 relative to the underlying silicon dioxide layer 175. The high etching selectivity ratio of the polysilicon layer 170 to the underlying silicon dioxide layer 175 reduces the possibility of overetching into the underlying silicon dioxide layer 175 after etching through the overlying polysilicon layer 170. A high etching selectivity ratio is desirable to prevent overetching and "breakthrough" into the underlying electrically insulating silicon dioxide layer 175. FIG. 5 is a graph showing the loss of underlying silicon dioxide, and the etching selectivity ratio of etching polysilicon relative to underlying silicon dioxide, for increasing volumetric flow ratio of inorganic fluorinated gas to total gas. The loss of thickness of the silicon dioxide layer 175 increased from 5 to about 32 Å with increasing volumetric flow ratio of $CF_4$, as shown in FIG. 5, resulted because the fluorine content of the $CF_4$ gas etches away silicon dioxide to form volatile $SiF_x$ gases. This reduces the etching selectivity ratio for etching polysilicon relative to silicon dioxide from about 14 to about 4, with the addition of 0 to 24 volume %, respectively, of inorganic fluorinated gas consisting of $CF_4$. The loss in etching selectivity ratio is undesirable because the underlying silicon dioxide layer 175, which is very thin in the newer integrated circuits, can be rapidly etched away as soon as the overlying polysilicon layer 170 is etched through.

Figure 6:
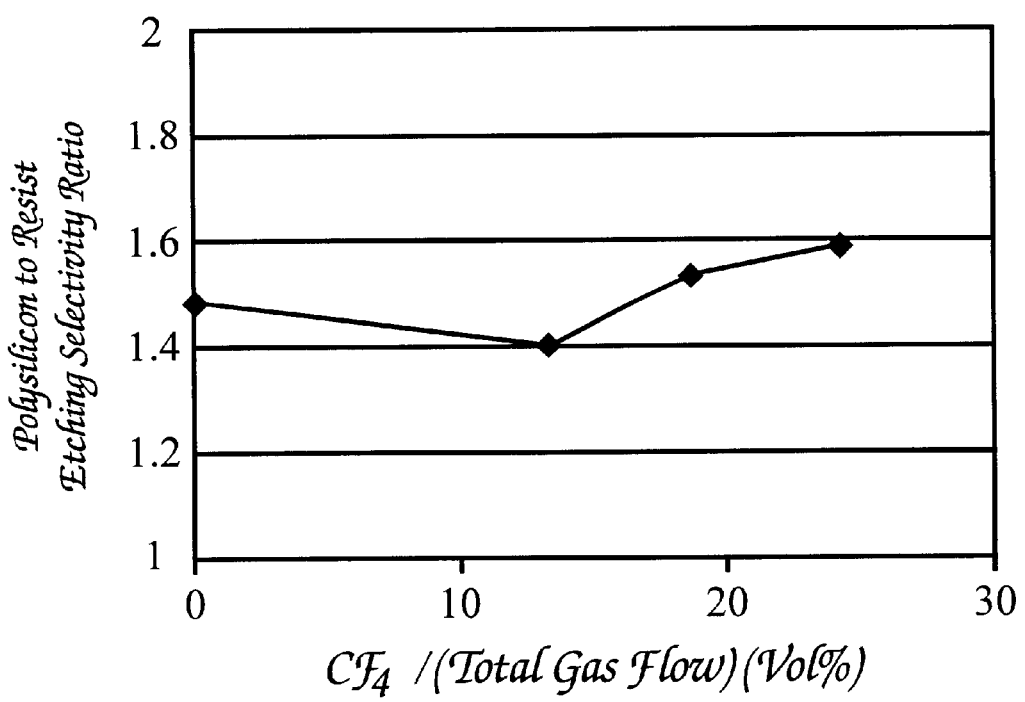
FIG. 6 is a graph showing the etching selectivity ratio of etching the polysilicon layer relative to the overlying resist layer for increasing volumetric flow ratio of inorganic fluorinated gas in the process gas.

It is also generally desirable to have a high etching selectivity for etching the polysilicon layer 170 relative to the resist layer 195, to avoid etching through the resist layer 195 before the polysilicon layer 170 is etched through. FIG. 6 shows the etching selectivity ratio for etching the polysilicon layer 170 relative to the overlying resist layer 195 for increasing volumetric flow ratio of inorganic fluorinated gas. The etching selectivity for etching the polysilicon layer 170 relative to the resist layer 195 generally increases a small amount from about 1.4 to about 1.6 with the addition of 0 to 24 volume %, respectively, of inorganic fluorinated gas such as $CF_4$. Thus the resist etching selectivity ratio is not adversely affected by the addition of the $CF_4$ gas.

FIG. 7 is a graph showing the reduction in deposition of etchant residue on the internal surfaces of the process chamber 50 (as measured by a quartz crystal microbalance 200) for increasing volumetric flow ratio of inorganic fluorinated gas. This graph demonstrates the substantial and unexpected cleaning of the etchant residue deposits on the internal chamber surfaces that is provided by the addition of the inorganic fluorinated gas to the process gas. An increase of $CF_4$ gas flow from 0 volume % to 24 volume % reduces the normalized rate of deposition of etchant residue deposits on the internal surfaces of the process chamber 50 from over 30 Å/min to under −80 Å/min. The negative values indicate that the etchant residue deposits were actually being removed from the microbalance 200 in the process instead of being deposited on the microbalance.

Table I lists the values of the normalized etchant residue deposition rates and polysilicon to silicon dioxide etching selectivity ratios for increasing $CF_4$ gas content in the process gas composition. The graphs demonstrate that the higher the $CF_4$ gas content, the better or lower is the normalized etchant residue deposition rates, and the lower the etching uniformity for etching doped to undoped polysilicon. In fact, at a $CF_4$ volume % flow of 24.3% of total gas flow, the normalized etchant residue deposition rate is −80 indicating etchant residue is actually removed, and the doped/undoped polysilicon etching uniformity drops to as low as 1.1.

TABLE I

| Volume % $CF_4$ | Normalized Etch Residue Deposition Rate (Å/min) | Doped Etch Rate (Å/min) | Polysilicon Etching Uniformity (1 σ) | Undoped Polysilicon Etch Rate (Å/min) | Doped/Undoped Polysilicon Etching Uniformity (Å/min) |
|---|---|---|---|---|---|
| 0 | 32 | 2612 | 1.22 | 2088 | 1.25 |
| 13.5 | −39 | 2304 | 0.85 | 1937 | 1.19 |
| 19 | −61 | 2311 | 0.48 | 1963 | 1.18 |
| 24.3 | −80 | 2316 | 0.65 | 2126 | 1.1 |

The interaction of the inorganic fluorinated gas constituent with the other gas constituents of the process gas composition is also unexpected. For example, FIG. 8 shows the change in etchant residue deposition rates on the internal surfaces of the process chamber 50 for increasing volume percentage of $CF_4$ and He—$O_2$. Generally, with a $CF_4$ gas content increase from 13.5 volume % to 24 volume %, the etchant residue deposition rates on the internal surfaces of the process chamber 50 is reduced from about −39 Å/min to about −80 Å/min. An increase of He—$O_2$ gas content from 16 to 25 sccm, reduces the rate of etchant residue deposition on the internal surfaces of the process chamber 50. However, a further increase of He—$O_2$ gas content from 25 to 40 sccm increases the rate of etchant residue deposition on the internal surfaces of the process chamber 50, which is undesirable. It is believed that the increase in etch residue deposition on the surfaces of the process chamber 50 with an increase in He—$O_2$ gas content, results because the $O_2$ in the He—$O_2$ reacts with silicon-containing materials and forms $SiO_2$ deposits on the chamber walls.

Table II lists the values of the normalized etch residue deposition rates and polysilicon to silicon dioxide etching selectivity ratios for increasing $CF_4$ and $He-O_2$ gas content in the process gas composition. Of these results, a $He-O_2$ gas content of 25 sccm and a $CF_4$ gas content of about 25 sccm, are preferred because these flow rates provide a balance between the polysilicon to silicon dioxide etching selectivity ratio and the rate of deposition of etch residue on the internal chamber surfaces. The volumetric flow ratios of oxygen-containing gas to inorganic fluorinated gas are selected so that the energized process gas cleans off substantially all etch residue deposits formed on internal surfaces of the process chamber, and has high selectivity of polysilicon to silicon dioxide. Preferably, the volumetric flow ratio of the oxygen gas, to the volumetric flow rate of the inorganic fluorinated gas is from about 1:1 to about 1:10, and more preferably about 1:1.5.

TABLE II

| $He-O_2$ Flow Rate (sccm) | 13.5 Volume % $CF_4$ | | 24 Volume % $CF_4$ | |
|---|---|---|---|---|
| | Normalized Etch Residue Deposition Rate | Polysilicon to Silicon Dioxide Etching Selectivity Ratio | Normalized Etch Residue Deposition Rate | Polysilicon to Silicon Dioxide Etching Selectivity Ratio |
| 16 | −39 | 5 | −80 | 3.65 |
| 25 | −48 | 6.65 | −108 | 5.06 |
| 40 | 0 | 8.4 | −86 | 6.2 |

Referring to Table III, this example illustrates a process for etching a polysilicon layer 170 on the substrate 45 using multiple stages, that include at least three separate stages, comprising an initial stage in which the anti-reflective BARC layer 190 is etched, a main polysilicon etching stage, and an overetch polysilicon etching stage. In the first stage, the BARC layer on the substrate 45 was etched by introducing a process gas comprising 40 sccm $Cl_2$ and 20 sccm $O_2$ into the process chamber 50, and forming an energized process gas by applying a RF source power of 300 Watts to the inductor coil and a RF bias power of 40 Watts to the cathode electrode 145. A pressure of 2 mTorr was maintained in the process chamber 50. During the process, the substrate 45 was cooled to a temperature of 50° C. by flowing helium on the backside of the substrate 45 at a pressure of about 8 Torr. An optical emission end point detector 165 was used to determine completion of etching of the BARC layer 190.

TABLE III

| Process Variable | | Step 1 BARC Etch | Step 2 Polysilicon Main Etch | Step 3 Polysilicon Overetch |
|---|---|---|---|---|
| $Cl_2$ | sccm | 40 | 60 | 0 |
| $O_2$ | sccm | 20 | 0 | 0 |
| HBr | sccm | 0 | 100 | 100 |
| $He-O_2$ | sccm | 0 | 16 | 6 |
| $CF_4$ | sccm | 0 | 25 | 0 |
| Source Power | Watt | 300 | 475 | 750 |
| Bias Power | Watt | 40 | 80 | 100 |
| Pressure | mTorr | 2 | 4 | 50 |
| Temperature | ° C. | 50 | 50 | 50 |
| Backside Helium | Torr | 8 | 8 | 8 |

After etching the BARC layer 190, the two successive polysilicon etching stages, namely the main etch and the overetch, were used to etch the polysilicon layer 170. The first or main etching stage used a more chemically reactive process gas containing inorganic fluorinated cleaning gas, such as $CF_4$, and in the second stage, the process gas was substantially absent the inorganic fluorinated gas to provide a less chemically reactive etching process. In the main etching stage, the process gas comprised 60 sccm $Cl_2$, 100 HBr sccm, 16 sccm $He-O_2$, and 25 sccm of $CF_4$, which provides a volumetric flow ratio of the combined flow rates of bromine-containing gas, chlorine-containing gas, and oxygen-containing gas to the flow rate of inorganic fluorinated gas of about 7:1. After the main etching stage, the optical emission endpoint detector 165 was used to detect and stop the etching process without etching through the underlying silicon dioxide layer 175 on the substrate 45.

In between the main etch stage and the overetch stage, a pump-out step was performed in which the process chamber 50 was exhausted of process gas by pumping down the chamber 50. In this step, the throttle valve 120 was maintained fully open for about 10 seconds, to achieve a pressure of less than 0.5 mTorr. The pump-out step was performed to exhaust and remove substantially all the residual inorganic fluorinated gas in the process zone 70 of the process chamber 50. The pump-out step significantly enhanced the etching selectivity of etching the polysilicon layer 170 to underlying silicon dioxide layer 175 by removing all of the aggressive inorganic fluorinated gas prior to the silicon dioxide layer 175 being exposed.

After the chamber 50 was pumped down, the overetch stage was performed to etch through the residual portion of the polysilicon layer 170. In this stage, the inorganic fluorinated gas content was entirely eliminated, to obtain slower and more controllable etching rates. In this stage, the process gas comprised 100 sccm HBr and 16 sccm $He-O_2$; the chamber pressure was 50 mTorr; the source power level was 750 Watts; and the RF bias power level was 100 Watts.

In this example, the remaining silicon dioxide gate oxide layer 175 had a thickness of about 3.3 nm (33 Å) below both the doped and undoped polysilicon regions. It is desirable to stop the etching process on the gate oxide layer because the active source and drain regions underlying the gate oxide layer 175 can undergo charge damage and lattice structural damage upon exposure to the energetic ions of the energized process gas.

In addition, this example provided etched features having profile angles of 87 to 88° for both the etched features of doped polysilicon as well as the etched features of undoped polysilicon, and in both the dense and isolated regions of the substrate 45. The profile angle, i.e., the angle between the sidewall of the etched feature and the plane of the substrate 45, is ideally about 90° to provide features having straight and substantially perpendicular sidewalls. Features having straight sidewalls can be formed closer leading to higher circuit densities and faster operating speeds.

The variations in critical dimensions for the etched features on the substrate 45 was also measured. Critical dimensions are predefined and desirable dimensions of the etched features needed to provide the desired electrical properties of the etched features in the design of integrated circuits. The critical dimensions are typically measured as a ratio or difference between the width $W_r$ of the resist features 195 and the width $W_e$ of the etched features. The closer the width of the etched feature to that of the resist feature the more predictable and reliable are the electrical properties of the etched feature. In newer integrated circuits, the line widths of interconnect lines and diameters of contact plugs are increasingly becoming smaller than 0.25 microns, to accommodate higher circuit densities. Because the electrical resistance of these features is proportional to the cross-sectional area of the etched features, it is important to maintain consistent and uniform dimensions without variations from feature to feature. Tapering cross-sections and cross-sectional profiles that vary as a function of the spacing of the features are no longer acceptable in these integrated circuits. In the present example, the densely packed feature portion of the substrate 45 (which had closely spaced etched features), exhibited a critical dimension loss of about −0.005 microns, and the isolated regions showed a critical dimension loss of about −0.003 microns.

In addition, prior art etching processes required cleaning and conditioning of the process chamber 50 to reduce contamination levels that resulted from excessive deposition of etch residue deposits on the internal chamber surfaces, after processing a large number of substrates 45. In contrast, the present etching and simultaneous cleaning process provided consistently high and uniform polysilicon etching rates of 3000 Å/min and a variation in etching rate of about 1.7%, during continuous etching of 3000 substrates without requiring a separate cleaning process step. The process has been found to uniformly remove etch residues, irrespective of their thickness or chemical stoichiometry; whereas prior art cleaning processes often fail to uniformly remove the etch residue deposits formed on chamber surfaces.

This example illustrates a process for etching a polysilicon layer 170 using a process gas comprising inorganic fluorinated gas consisting of $NF_3$. Three separate stages, including an initial stage in which the anti-reflective 190 BARC layer is etched, a main polysilicon etching stage, and an overetch polysilicon etching stage, were used, as listed in Table IV.

As in the prior example, in between the main etch stage and the overetch stage, a pump-out step was performed in which the process chamber 50 was exhausted of process gas by pumping down the process chamber 50. In this step, the throttle valve 120 was maintained fully open for about 10 seconds, to achieve a pressure of less than 0.5 mTorr. The pump-out step was performed to exhaust and remove substantially all the residual content of inorganic fluorinated gas in the process chamber 50. The pump-out step significantly enhanced the etching selectivity of the polysilicon layer 170 to underlying silicon dioxide layer 175. Only after the process chamber 50 was pumped out, was the overetch stage performed to etch through the residual portion of the polysilicon layer 170.

In this example the remaining silicon dioxide gate oxide layer 175 had a thickness of about 3.4 nm (34 Å) below both the doped and undoped polysilicon regions, and provided etched features having profile angles of 87 to 88°. In addition, the normalized rate of deposition of etch residue on the chamber walls, as measure by the microbalance, was about −64 Å/minute as compared to −9 Å/minute for the equivalent flow rate of $CF_4$ gas in the process gas composition. Thus the $NF_3$ gas composition provided better cleaning results that the $CF_4$ gas composition. In addition, the $NF_3$ based gas composition provided better etching selectivity for etching polysilicon relative to silicon dioxide, by providing an etching selectivity ratio of 8:1 as compared to 5:1 for $CF_4$ gas.

TABLE IV

| Process Variable | | Step 1 BARC Etch | Step 2 Polysilicon Main Etch | Step 3 Polysilicon Overetch |
|---|---|---|---|---|
| $Cl_2$ | sccm | 40 | 60 | 0 |
| $O_2$ | sccm | 20 | 16 | 0 |
| HBr | sccm | 0 | 100 | 100 |
| He-$O_2$ | sccm | 0 | 16 | 6 |
| $CF_4$ | sccm | 0 | 25 | 0 |
| Source Power | Watt | 300 | 475 | 750 |
| Bias Power | Watt | 40 | 80 | 100 |
| Pressure | mTorr | 2 | 4 | 50 |
| Temperature | °C. | 50 | 50 | 50 |
| Backside Helium | Torr | 8 | 8 | 8 |

The present invention has been described with reference to certain preferred versions thereof; however, other versions are possible. For example, the treatment and cleaning process of the present invention can be used for treating chambers for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the preferred versions contained herein.

What is claimed is:

1. A method of etching a substrate, the method comprising the steps oft
    (a) placing the substrate in a process chamber, the substrate comprising a silicon-containing material comprising regions having different dopants or different dopant concentrations; and
    (b) exposing the substrate to an energized process gas comprising a bromine-containing gas, a chlorine-containing gas, a fluorine-containing gas, and an oxygen-containing gas, wherein the energized process gas etches the regions of different dopants or different dopant concentrations at substantially the same rate.

2. A method according to claim 1 wherein the volumetric flow ratio of the bromine-containing gas, chlorine-containing gas, fluorine-containing gas, and oxygen-containing gas is selected so that the energized process gas etches the regions having different dopants or different dopant concentrations at substantially the same etching rate.

3. A method according to claim 1 wherein the volumetric flow ratio of the bromine-containing gas, chlorine-containing gas, fluorine-containing gas, and oxygen-containing gas is selected so that the energized process gas cleans off etch residue deposits formed on internal surfaces of the process chamber during etching of the silicon-containing material.

4. A method according to claim 3 wherein the volumetric flow ratio of the combined volumietric flow rates of the bromine-containing gas, chlorine-containing gas, and oxygen-containing gas, to the volumetric flow rate of the fluorine-containing gas is from about 4:1 to about 20:1.

5. A method according to claim 1 wherein the bromine-containing gas comprises one or more of HBr, $Br_2$, or $CH_3Br$.

6. A method according to claim 1 wherein the chlorine-containing gas comprises one or more of $Cl_2$ or HCl.

7. A method according to claim 1 wherein the oxygen-containing gas comprises one or more of $O_2$ or He—$O_2$.

8. A method according to claim 1 wherein the energized process gas comprises HBr, $Cl_2$, He—$O_2$, and one or more of $NF_3$, $CF_4$, and $SF_6$.

9. A method according to claim 1 wherein the energized process gas consists essentially of HBr, $Cl_2$, He—$O_2$, and $CF_4$.

10. A method according to claim 1 wherein the silicon-containing material comprises polysilicon.

11. A method according to claim 1 wherein the fluorine-containing gas comprises an inorganic fluorinated gas.

12. A method according to claim 11 wherein the inorganic fluorinated gas comprises one or more of $NF_3$, $CF_4$, or $SF_6$.

13. A method according to claim 1 wherein the regions with different dopants or different dopant concentrations comprise a first region comprising n-type dopant and a second region comprising p-type dopant.

14. A method according to claim 1 wherein the regions with different dopants or different dopant concentrations comprise a first region comprising boron-containing material and a second region comprising phosphorous-containing material.

15. A method according to claim 1 wherein the regions with different dopants or different dopant concentrations comprise an undoped region and a doped region.

16. A method according to claim 1 wherein the regions having different dopants or different dopant concentrations comprise regions having different concentrations of the same dopant.

17. A method according to claim 1 wherein the regions having different dopants or different dopant concentrations comprise a first doped regiopn and a second doped region, wherein the second doped region has a lower dopant concentration than the first doped region.

18. A method according to claim 1 wherein the regions with different dopants or different dopant concentrations comprise a region of unactivated dopant.

19. A method of etching a substrate, the method comprising the steps of:
   (a) placing the substrate in a process chamber, the substrate comprising material having a doped region; and
   (b) exposing the substrate and internal surfaces of the process chamber to an energized process gas comprising a bromine-containing gas; a chlorine-containing gas; a fluorine-containing gas; and an oxygen-containing gas in a volumetric flow ratio selected to simultaneously etch the material having a doped region and clean the internal surfaces of the process chamber.

20. A method according to claim 19 wherein the volumetric flow ratio of the bromine-containing gas, chlorine-containing gas, fluorine-containing gas, and oxygen-containing gas is selected so that the energized process gas etches regions having different dopants or different dopant concentrations in the material at substantially the same rate.

21. A method according to claim 19 wherein the volumetric flow ratio of the bromine-containing gas, chlorine-containing gas, fluorine-containing gas, and oxygen-containing gas is selected so that the energized process gas cleans off etch residue deposits formed on internal surfaces of the process chamber during etching of the material.

22. A method according to claim 21 wherein the volumetric flow ratio of the combined volumetric flow rates of the bromine-containing gas, chlorine-containing gas, and oxygen-containing gas, to the volumetric flow rate of the fluorine-containing gas is from about 4:1 to about 20:1.

23. A method according to claim 19 wherein the volumetric flow ratio of the oxygen-containing gas and fluorine-containing gas is selected so that the energized process gas cleans off substantially all etch residue deposits formed on internal surfaces of the process chamber, and has a selectivity of etching polysilicon to silicon dioxide.

24. A method according to claim 23 wherein the volumetric flow ratio of the volumetric flow rate of the oxygen-conataining gas to the volumetric flow ratio of the fluorine-containing gas is from abut 1:1 to about 1:10.

25. A method according to claim wherein the energized process gas consists essentially of HBr, $Cl_2$, He—$O_2$, and $CF_4$.

26. A method according to claim 19 wherein the bromine-containing gas comprises one or more of HBr, $Br_2$, and $CH_3Br$.

27. A method according to claim 19 wherein the chlorine-containing gas comprises one or more of $Cl_2$ and HCl.

28. A method according to claim 19 wherein the fluorine-containing gas comprises one or more of $NF_3$, $CF_4$, and $SF_6$.

29. A method according to claim 19 wherein the oxygen-containing gas comprises one or more of $O_2$ and He—$O_2$.

30. A method of etching a substrate, the method comprising the steps of:
   (a) placing the substrate in a process chamber, the substrate comprising a silicon-containing material having a first region with a first dopant or dopant concentration and a second region with a second dopant or dogant concentration; and
   (b) exposing the silicon-containing material on the substrate to an energized process gas comprising a bromine-containing gas selected from the group consisting of HBr, $Br_2$, and $CH_3Br$; a chlorine-containing gas selected from the group consisting of $Cl_2$ and HCl; aninorganic fluorinated gas selected from the group consisting of $NF_3$, $CF_4$, and $SF_6$; and an oxygen-containing gas selected from the group consisting of $O_2$ and He—$O_2$,
   wherein the volumetric flow ratio of the combined volumetric flow rates of the bromine-containing gas, chlorine-containing gas, and oxygen-containing gas, to the volumetric flow rate of the inorganic fluorinated gas, is selected to etch the first and second regions at etching rates that differ by less than about 19%.

31. A method according to claim 30 wherein the volumetric flow ratio of the bromine-containing gas, chlorine-containing gas, inorganic fluorinated gas, and oxygen-containing gas is selected so that the energized process gas cleans off the etch residue deposits formed on internal surfaces of the process chamber during etching of the silicon-containing material.

32. A method according to claim wherein the energized process gas consists essentially of HBr, $Cl_2$, He—$O_2$, and $CF_4$.

33. A method according to claim 30 wherein the first region is undoped.

34. A method according to claim 30 wherein the volumetric flow ratio is also selected to clean internal surfaces of the process chamber.

35. A method of etching a substrate, the method comprising the steps of:
   (a) placing a substrate having silicon-containing material in a process chamber;
   (b) in a first etching stage, providing in the process chamber an energized first process gas comprising etching gas for etching the silicon-containing material on the substrate, and cleaning gas for cleaning deposits formed on internal surfaces of the process chamber during etching of the silicon-containing material;
   (c) in a pump-out stage, stopping the flow of the first process gas and exhausting the energized first process gas from the process chamber; and
   (d) in a second etching stage, providing in the process chamber an energized second process gas comprising etching gas for etching the silicon-containing material on the substrate, the energized second process gas being substantially absent the cleaning gas.

36. A method according to claim 35 wherein the cleaning gas comprises one or more of $NF_3$, $CF_4$, and $SF_6$.

37. A method according to claim 35 wherein the etching gas comprises a bromine-containing gas selected from the group consisting of HBr, $Br_2$, and $CH_3Br$, a chlorine-containing gas selected from the group consisting of $Cl_2$ and HCl; and an oxygen-containing gas selected from the group consisting of $O_2$ and He—$O_2$.

38. A method according to claim 35 wherein the pump-out stage comprises exhausting the energized first process gas from the process chamber until the process chamber is at a pressure of less than about 0.5 mTorr.

39. A method according to claim 35 wherein the pump-out stage comprises exhausting the energized first process gas from the process chamber for from about 5 to about 15 seconds.

40. A method according to claim 35 wherein the cleaning gas comprises a fluorine-containing gas.

41. A method of etching a substrate, the method comprising the steps of:
   (a) placing the substrate in a process chamber, the substrate comprising a silicon-containing material having a doped region and an undoped region; and
   (b) exposing the silicon-containing material on the substrate to an energized process gas comprising bromine, chlorine, fluorine, and oxygen,
   wherein the volumetric flow rates of the components of the process gas are selected to etch the doped and undoped regions at substantially the same rate.

42. A method according to claim 41 wherein the volumetric flow rates are selected so that the energized process gas cleans off etch residue deposits formed on internal surfaces of the process chamber during etching of the silicon-containing material.

43. A method according to claim 41 wherein the process gas comprises one or more of HBr, $Br_2$, or $CH_3Br$.

44. A method according to claim 41 wherein the process gas comprises one or more of $Cl_2$ or HCl.

45. A method according to claim 41 wherein the process gas comprises an inorganic fluorinated gas.

46. A method according to claim 45 wherein the inorganic fluorinated gas comprises one or more of $NF_3$, $CF_4$, or $SF_6$.

47. A method according to claim 41 wherein the process gas comprises one or more of $O_2$ or He—$O_2$.

48. A method of etching a substrate, the method comprising the steps of:
   (a) placing the substrate in a process chamber, the substrate comprising a silicon-containing material having regions of different dopants or different dopant concentrations; and
   (b) exposing the substrate to an energized process gas comprising a first halogen-containing gas and a second halogen-containing gas, wherein the volumetric flow ratio of the first halogen-containing gas and the second halogen-containing gas is selected so that the energized process gas etches the regions of different dopants or different dopant concentrations at substantially the same etching rate.

49. A method according to claim 48 wherein the process gas comprises a chlorine-containing gas and a bromine-containing gas.

50. A method according to claim 48 wherein the process gas comprises an inorganic fluorinated gas.

51. A method according to claim 48 wherein the process gas comprises a fluorine-containing gas.

52. A method according to claim 48 wherein the energized process gas further comprises an oxygen-containing gas.

53. A method according to claim 48 wherein the conditions of the energized process gas are selected to clean internal surfaces of the process chamber.

54. A method of etching a substrate, the method comprising the steps of:
   (a) placing the substrate in a process chamber, the substrate comprising a silicon-containing material having regions of different dopants or different dopant concentrations; and
   (b) exposing the substrate to an energized process gas, wherein the energized process gas comprises a chlorine-containing gas and is introduced at a volumetric flow rate selected to etch the regions of different dopants or different dopant concentrations at substantially the same rate.

55. A method according to claim 54 wherein the energized process gas comprises a fluorine-containing gas.

56. A method according to claim 54 wherein the energized process gas comprises an inorganic fluorinated gas.

57. A method according to claim 54 wherein the energized process gas comprise a bromine-containing gas.

58. A method according to claim 54 wherein the energized process gas comprises an oxygen-containing gas.

59. A method according to claim 54 wherein the conditions of the energized process gas are selected to clean surfaces of the process chamber.

60. A method of etching a substrate, the method comprising the steps of:
   (a) placing the substrate in a process chamber, the substrate comprising a silicon-containing material comprising regions having different dopants or different dopant concentrations; and
   (b) exposing the substrate to an energized process gas comprising a bromine-containing gas, a chlorine-containing gas, a fluorine-containing gas, and an oxygen-containing gas, wherein the volumetric flow ratio of the combined volumetric flow rates of the bromine-containing gas, chlorine-containing gas, and oxygen-containing gas, to the volumetric flow rate of the fluorine-containing gas is from about 4:1 to about 20:1.

61. A method according to claim 60 wherein the energized process gas comprises HBr, $Cl_2$, He—$O_2$, and one or more of $NF_3$, $CF_4$, and $SF_6$.

62. A method according to claim 60 wherein the energized process gas consists essentially of HBr, $Cl_2$, He—$O_2$, and $CF_4$.

63. A method of etching a substrate, the method comprising the steps of:
   (a) placing the substrate in a process chamber, the substrate comprising a silicon-containing material comprising regions having different dopants or different dopant concentrations; and
   (b) exposing the substrate to an energized process gas consisting essentially of HBr, $Cl_2$, He—$O_2$, and $CF_4$, wherein the energized process gas etches the silicon-containing material comprising the regions having different dopants or different dopant concentrations.

64. A method according to claims 63 wherein the volumetric flow ratio of the combined volumetric flow rates of the HBr, $Cl_2$, and He—$O_2$, to the volumetric flow rate of the $CF_4$ is from about 4:1 to about 20:1.

65. A method according to claim 63 wherein the volumetric flow ratio of the combined volumetric flow rates of HBr, $Cl_2$, and He-$O_2$, to the volumetric flow rate of the $CF_4$ is from about 4:1 to about 20:1.

* * * * *